(12) United States Patent
Isobe et al.

(10) Patent No.: US 9,887,281 B2
(45) Date of Patent: Feb. 6, 2018

(54) SEMICONDUCTOR DEVICE (71) Applicant: KABUSHIKI KAISHA TOSHIBA, Tokyo (JP)

(72) Inventors: Yasuhiro Isobe, Kanazawa Ishikawa (JP); Hung Hung, Nonoichi Ishikawa (JP); Akira Yoshioka, Kanazawa Ishikawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 15/231,387

(22) Filed: Aug. 8, 2016

(65) Prior Publication Data
US 2017/0263741 A1 Sep. 14, 2017

(30) Foreign Application Priority Data
Mar. 10, 2016 (JP) .................................. 2016-047499

(51) Int. Cl.
*H01L 29/778* (2006.01)
*H01L 29/20* (2006.01)
(Continued)

(52) U.S. Cl.
CPC .......... *H01L 29/778* (2013.01); *H01L 29/201* (2013.01); *H01L 29/2003* (2013.01);
(Continued)

(58) Field of Classification Search
CPC ............. H01L 29/205; H01L 29/66431; H01L 29/66439; H01L 29/778; H01L 29/7786;
(Continued)

(56) References Cited

U.S. PATENT DOCUMENTS

2005/0151255 A1\* 7/2005 Ando .................... H01L 29/475
257/750
2011/0062556 A1\* 3/2011 Komiyama ....... H01L 21/02458
257/615

(Continued)

FOREIGN PATENT DOCUMENTS

| JP | 2010251738 A | 11/2010 |
| JP | 2015056627 A | 3/2015 |
| WO | 2015152411 A1 | 10/2015 |

*Primary Examiner* — Fei Fei Yeung Lopez
(74) *Attorney, Agent, or Firm* — Patterson & Sheridan, LLP (57) ABSTRACT

A semiconductor device includes a first stacked portion above a substrate, the first stacked portion comprising a first nitride semiconductor layer containing aluminum and a second nitride semiconductor layer containing carbon, a third nitride semiconductor layer on the first stacked portion, the third nitride semiconductor layer containing carbon and having a greater thickness than each of the first and second nitride semiconductor layers, the third nitride semiconductor layer having a lower carbon concentration than the second nitride semiconductor layer, a second stacked portion on the third nitride semiconductor, the second stacked portion comprising a fourth nitride semiconductor layer containing aluminum and a fifth nitride semiconductor layer containing carbon, a sixth nitride semiconductor layer on the second stacked portion, a seventh nitride semiconductor layer on the sixth nitride semiconductor layer and containing aluminum, and a first electrode on the seventh nitride layer.

19 Claims, 4 Drawing Sheets

(51) Int. Cl.
  *H01L 29/207* (2006.01)
  *H01L 29/205* (2006.01)
  *H01L 29/66* (2006.01)
  *H01L 29/201* (2006.01)
  *H01L 29/36* (2006.01)

(52) U.S. Cl.
  CPC .......... *H01L 29/205* (2013.01); *H01L 29/207* (2013.01); *H01L 29/36* (2013.01); *H01L 29/66431* (2013.01); *H01L 29/66439* (2013.01); *H01L 29/66462* (2013.01); *H01L 29/7786* (2013.01)

(58) Field of Classification Search
  CPC ... H01L 29/36; H01L 29/2003; H01L 29/201; H01L 29/207; H01L 29/66462
  See application file for complete search history.

(56) References Cited

U.S. PATENT DOCUMENTS

| | | | |
|---|---|---|---|
| 2014/0197418 A1* | 7/2014 | Chen | H01L 21/0254 257/76 |
| 2015/0021661 A1* | 1/2015 | Chen | H01L 21/02458 257/190 |

* cited by examiner

SEMICONDUCTOR DEVICE

CROSS-REFERENCE TO RELATED APPLICATION

This application is based upon and claims the benefit of priority from Japanese Patent Application No. 2016-047499, filed Mar. 10, 2016, the entire contents of which are incorporated herein by reference.

FIELD

Exemplary embodiments described herein relate generally to a semiconductor device.

BACKGROUND

A problem with a nitride semiconductor element, such as a gallium nitride (GaN) semiconductor element, is current collapse that decreases an ON-state current. Additionally, improvement of the breakdown voltage of the element, reduction in the number of cracks in the element, and suppression of warp of a silicon substrate on which the element is formed are desired. In order to improve the performance or alleviate these issues, a buffer layer between a silicon substrate and a channel portion of the element (a GaN layer) is employed.

The greater the thickness of the buffer layer, the more the breakdown voltage of the element is improved, and this improvement leads to suppressing of the current collapse phenomenon. However, it is easy for a pit (a cavity or a hole) or a crack to occur in the buffer layer, and the thicker the buffer layer, the greater the size of the pit or the crack. Therefore, when the buffer layer is thickened in order to improve the breakdown voltage, front surface states of the buffer layer or the channel portion deteriorate due to pits or cracks. Accordingly, a problem, such as an increase in leakage current, that degrades electric performance of the semiconductor element, occurs.

DETAILED DESCRIPTION

One embodiment provides a semiconductor device that is equipped with a thick buffer layer in which there are fewer pits or cracks.

In general, according to one embodiment, a semiconductor device includes a substrate, a first stacked portion located above the substrate, the first stacked portion comprising at least one first nitride semiconductor layer containing aluminum and a second nitride semiconductor layer containing carbon, a third nitride semiconductor layer located on an upper surface of the first stacked portion, the third nitride semiconductor layer containing carbon and having a greater thickness than each of the first and second nitride semiconductor layers, the third nitride semiconductor layer having a lower carbon concentration than the second nitride semiconductor layer, a second stacked portion located on an upper surface of the third nitride semiconductor, the second stacked portion comprising a fourth nitride semiconductor layer containing aluminum, and a fifth nitride semiconductor layer containing carbon, a sixth nitride semiconductor layer located on the second stacked portion, a seventh nitride semiconductor layer located on an upper surface of the sixth nitride semiconductor layer and containing aluminum, and a first electrode located on an upper surface of the seventh nitride layer.

Embodiments will be described below referring to the drawings. The present embodiment imposes no limitation to the exemplary embodiment. According to the following embodiment, the direction vertical to a substrate indicates a direction relative to a surface on which a semiconductor element is provided, if the surface is defined as being positioned upward, and, in some cases, is different from the vertical direction in accordance with gravitational acceleration.

Figure 1:
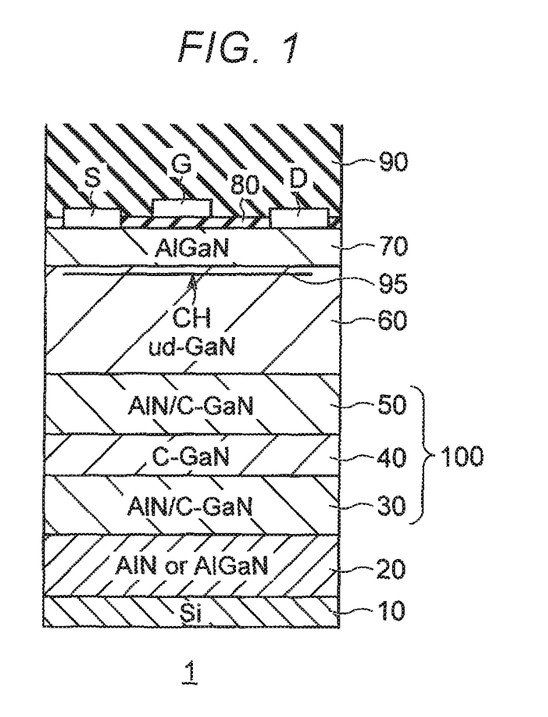
FIG. 1 is a cross-sectional diagram of one example of a constitution of a semiconductor device according to the present embodiment.

FIG. 1 is a cross-sectional diagram illustrating one example of a constitution of a semiconductor device 1 according to the present embodiment. The semiconductor device 1 includes a substrate 10, a first buffer layer 20, a second buffer layer 100, a undoped GaN (ud-GaN) layer 60, an AlGaN layer 70, a gate insulating film 80, an interlayer insulating film 90, a drain electrode D, a source electrode S, and a gate electrode G. The semiconductor device 1, for example, is a metal insulator semiconductor (MIS) type GaN-high electron mobility transistor (HEMT). Moreover, illustrations of wiring, a contact, and the like, which are provided within or on the interlayer insulating film 90 are omitted.

The composition of the substrate 10 includes at least one or more of sapphire, diamond, SiC, GaN, BN, Si, and Ge, and the substrate 10 is, for example, a silicon substrate, a GaN substrate, or a SiC substrate. The conductivity type (for example, n-type or p type) of the substrate 10 is particularly not limited.

The first buffer layer 20 is provided on a front surface of the substrate 10. For the first buffer layer 20, for example, a an AlN layer or an AlGaN layer, or a stacked structure of both an AlN layer and an AlGaN layer is used. The first buffer layer 20 is interposed between the substrate 10 and the second buffer layer 100 (30, 40, and 50), that thus large stress due to a large difference in lattice constant between the substrate 10 and the second buffer layer 100 is suppressed and warping, cracking, or the like of the substrate 10 is suppressed. Furthermore, the first buffer layer 20 improves a breakdown voltage of the semiconductor device 1. Moreover, if the substrate 10 is a GaN substrate or the like, in some cases, the first buffer layer 20 is unnecessary.

The second buffer layer 100 is provided on the upper surface of the substrate 10 and the first buffer layer 20. The second buffer layer 100 includes a first stacked portion 30, a nitride semiconductor layer 40, and a second stacked portion 50. The second buffer layer 100 is interposed between the first buffer layer 20 and the ud-GaN layer 60, and thus large stress due to a large difference in lattice constant between the first buffer layer 20 and the ud-GaN layer 60 is decreased. Furthermore, the second buffer layer 100 improves the breakdown voltage of the semiconductor device 1.

Figure 2:
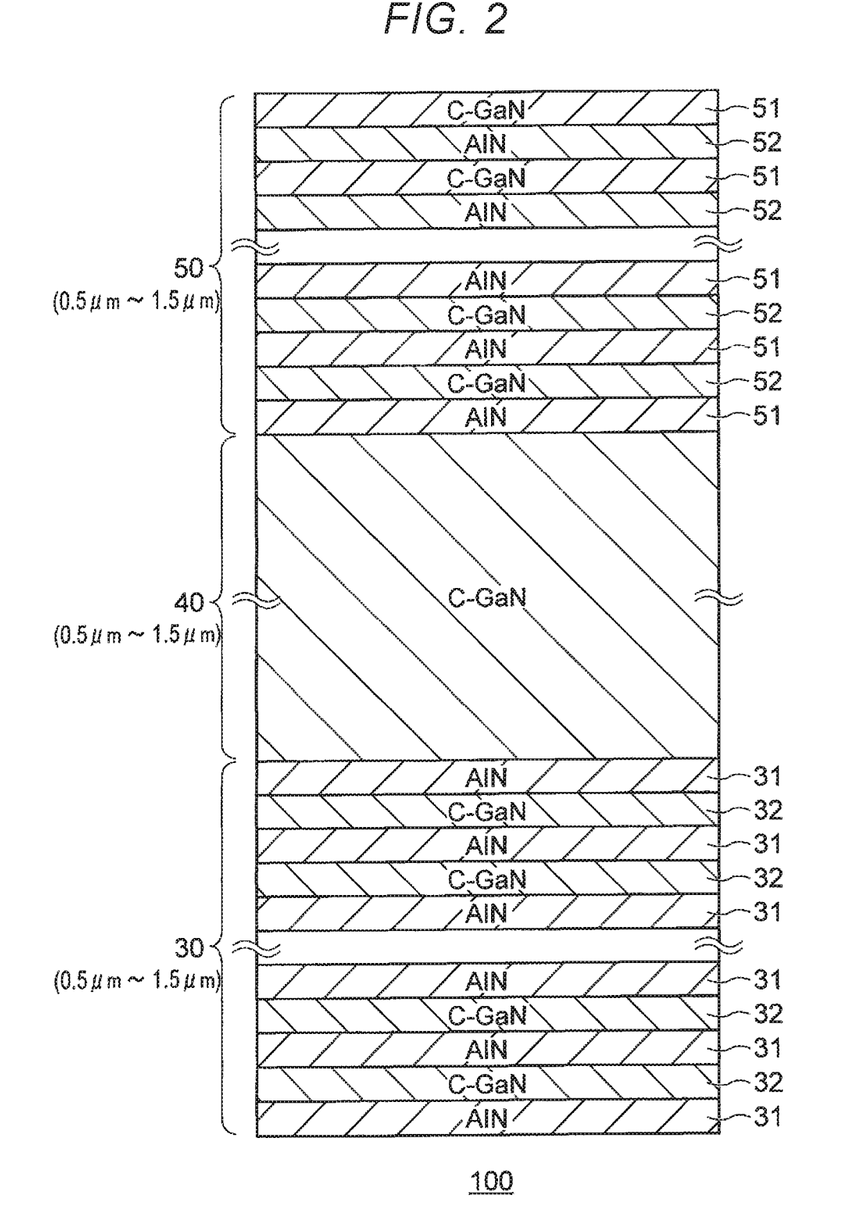
FIG. 2 is a cross-sectional diagram illustrating one example of a constitution of a second buffer layer.

The first stacked portion 30 is provided on the upper surface of the substrate 10 and the first buffer layer 20. The first stacked portion 30, as illustrated in FIG. 2, has a stacked structure in which a plurality of AlN layers 31 (a first nitride semiconductor layer) that contain aluminum and C—GaN layers 32 (a second nitride semiconductor layer) that contain carbon are alternately stacked on top of each other. Moreover, the first stacked portion 30 may be a superlattice film that includes a multi-layer structure of the AlN layer 31 and the C—GaN layer 32.

The C—GaN layer 40 as a third nitride semiconductor layer is provided on the upper surface of the first stacked portion 30, and is a GaN layer that contains carbon. The thickness of the C—GaN layer 40 is greater than the thickness of the AlN layer 31 and the thickness of the C—GaN layer 32. For example, the thickness of the C—GaN layer 40 is 0.5 μm to 1.5 μm. However, carbon concentration of the C—GaN layer 40 is lower than carbon concentration of the C—GaN layer 32. For example, the carbon concentration of the C—GaN layer 40 is $1 \times 10^{17}/cm^3$ to $1 \times 10^{19}/cm^3$. The C—GaN layer 40 contains carbon, and thus the breakdown voltage of the semiconductor device 1 is improved. On the other hand, when the carbon concentration of the C—GaN layer 40 is excessively high, a problem (current collapse) of on-state current decrease in operation of the semiconductor device 1 occurs. Therefore, as described above, the C—GaN layer 40 contains carbon, but has lower carbon concentration than the C—GaN layer 32.

The second stacked portion 50 is provided on the upper surface of the C—GaN layer 40, and has a stacked structure in which a plurality of AlN layers 51 (a fourth nitride semiconductor layer) that contain aluminum and C—GaN layers 52 (a fifth nitride semiconductor layer) that contain carbon are alternately stacked on top of each other. Moreover, the second stacked portion 50 may be a superlattice-structured film that includes the AlN layer 51 and the C—GaN layer 52.

The second buffer layer 100 is a buffer layer in which the C—GaN layer 40 is interposed between the first stacked portion 30 and the second stacked portion 50, and is a stacked body that includes the first stacked portion 30, the C—GaN layer 40, and the second stacked portion 50. The AlN layer 51 and the C—GaN layer 52 may be films (the same films) each of which has the same material as and the same thickness as the AlN layer 31 and the C—GaN layer 32. That is, the second stacked portion 50 may basically have the same structure as the first stacked portion 30. The first stacked portion 30, the second stacked portion 50, and the C—GaN layer 40 will be further described herein with reference to FIG. 2.

The ud-GaN layer 60 as a sixth nitride semiconductor layer is provided on the upper surface of the second buffer layer 100. For the ud-GaN layer 60, an undoped GaN layer into which impurities, such as carbon, are not intentionally doped, is used.

The AlGaN layer 70 as a seventh nitride semiconductor layer is provided on the upper surface of the ud-GaN layer 60. The ud-GaN layer 60 and the AlGaN layer 70 together form a hetero-junction structure, and thus a two-dimensional electron gas (which is hereafter referred to as "2 Dimensional Electron Gas (2DEG)") layer 95 occurs at and adjacent to the interface between the ud-GaN layer 60 and the AlGaN layer 70.

The source electrode S as a first electrode and the drain electrode D as a second electrode are provided on the upper surface of the AlGaN layer 70, and are electrically connected to the 2DEG layer 95 via the AlGaN layer 70. The gate electrode G is provided above the AlGaN layer 70 and is disposed between the source electrode S and the drain electrode D. The gate electrode G is provided over the AlGaN layer 70 with the gate insulating film 80 located therebetween. The gate electrode G may alternatively be in contact with the upper surface of the AlGaN layer 70 without an intervening gate insulating film 80. For the source electrode S, the drain electrode D, and the gate electrode G, a conductive material, such as metal, is used.

The protective interlayer insulating film 90 covers the source electrode S, the drain electrode D, the gate electrode G.

As described above, the 2DEG layer 95 occurs at and adjacent to the interface between the ud-GaN layer 60 and the AlGaN layer 70. When the gate electrode is properly charged, the 2DEG layer 95 decreases the electric resistance between the drain electrode D and the source electrode S and of decreases the on resistance of the semiconductor device 1.

When a gate voltage is not applied, if the 2DEG layer 95 occurs at a channel portion CH below the gate electrode G, the semiconductor device 1 becomes a GaN-HEMT that has a normally-ON structure. In this case, the semiconductor device 1 goes into an OFF state by negatively applying the gate voltage. On the other hand, when the gate voltage is not applied, if the 2DEG layer 95 does not occur at the channel portion CH below the gate electrode G, the semiconductor device 1 becomes a GaN-HEMT that has a normally-off structure. In this case, the semiconductor device 1 goes into an ON state by positively applying the gate voltage. In any of the normally-ON structure and the normally-OFF structure, the 2DEG layer 95 is maintained along a current path between the drain electrode D and the channel portion CH and a current path between the source electrode S and the channel portion CH. Therefore, when the semiconductor device 1 goes into the ON state, current flows with a low on resistance from the drain electrode D to the source electrode S via the 2DEG layer 95 and the channel portion CH.

FIG. 2 is a cross-sectional diagram illustrating one example of a constitution of the second buffer layer 100. The first stacked portion 30 has a stacked structure in which aluminum nitride (AlN) layers 31 and gallium nitride (C—GaN) layers 32 that contain carbon are alternately stacked on top of each other. The thickness of the AlN layers 31, for example, are 3 nm to 6 nm, and the thickness of the C—GaN layers 32, for example, are 10 nm to 50 nm. An AlN layer 31 and a C—GaN layer 32, for example, are alternately formed on top of each other, using a metal organic chemical vapor deposition (MOCVD) method or a molecular beam expitaxy (MBE) method. The entire thickness of the first stacked portion 30, for example, is 0.5 μm to 1.5 μm. Therefore, the first stacked portion 30, for example, is formed by repeatedly forming AlN layers 31 and C—GaN layers 32 that are several nm's in thickness until a total thickness of the first stacked portion 30 of 0.5 μm to 1.5 μm is obtained.

The C—GaN layer 32 is formed while being doped with carbon. The carbon concentration of the C—GaN layer 32, for example, is $1 \times 10^{18}/cm^3$ to $3 \times 10^{19}/cm^3$, and is greater than that of the C—GaN layer 40. If a ud-GaN layer and an AlN layer are stacked, because there is a large difference in lattice constant between the AlN layer and the ud-GaN layer, distortion occurs at a crystal structure of an interface between the AlN layer and the ud-GaN layer, and due to a piezoelectric field effect, it is easy for the 2DEG to occur at a front surface of the ud-GaN layer. In this case, there is a concern that leakage current in the first stacked portion 30 will increase and the breakdown voltage of the semiconductor device 1 will decrease. According to the present embodiment, the AlN layers 31 and the C—GaN layers 32 that have comparatively high carbon concentration are stacked. Accordingly, an electric charge that occurs in the C—GaN layer 32 is dissipated (canceled) by the carbon. Therefore, the first stacked portion 30 maintains a high resistance state, and suppresses the leakage current. As a result, a decrease in the breakdown voltage of the semiconductor device 1 can be suppressed.

On the other hand, as with the C—GaN layer 32, formation of the GaN layer while doping with carbon is a main factor that decreases quality of a GaN crystal and forms a pit or the crack. Therefore, when the first stacked portion 30 is simply thickened in order to improve the breakdown voltage of the semiconductor device 1, it is easy for the pit or the crack to occur in the first stacked portion 30. The pit or the crack can propagate into other films (the C—GaN layer 40, the second stacked portion 50, the ud-GaN layer 60, the AlGaN layer 70, and the like) that are provided on the upper surface of the first stacked portion 30 and further become a large pit or a large crack, respectively. According to the present embodiment, by providing the C—GaN layer 40, the thickness of the first stacked portion 30 is decreased and thus the occurrence of the pit or the crack is suppressed.

The C—GaN layer 40 is provided on the upper surface of the first stacked portion 30, and is a GaN layer that contains carbon. The thickness of the C—GaN layer 40 is greater than the thickness of the AlN layer 31 and the thickness of the C—GaN layer 32, and for example, is 0.5 µm to 1.5 µm. That is, the C—GaN layer 40 is significantly greater in thickness than the AlN layer 31 and the C—GaN layer 32, and has the same thickness as the first stacked portion 30. However, the thickness of the C—GaN layer 40 need not necessarily be the same as the thickness of the first stacked portion 30, and may be different from the thickness of the first stacked portion 30. However, the carbon concentration of the C—GaN layer 40 is lower than the carbon concentration of the C—GaN layer 32. For example, the carbon concentration of the C—GaN layer 40 is $1 \times 10^{17}/cm^3$ to $1 \times 10^{19}/cm^3$. Accordingly, the C—GaN layer 40 can improve the breakdown voltage value of the semiconductor device 1, and can suppress the current collapse phenomenon. The C—GaN layer 40 may contain aluminum, and for example, may be a $C$-$Al_xGa_{(1-x)}N$ layer that contains carbon where $0 \leq x < 1$.

A C—GaN layer 40 having a comparatively low carbon concentration is provided on the upper surface of the first stacked portion 30, and thus an effect in which the C—GaN layer 40 buries any pit or crack that occurs in the first stacked portion 30 is obtained. Accordingly, formation or propagation of the pit or the crack can be suppressed. That is, by using the structure according to the present embodiment, for example, the second buffer layer 100 can be thickened to 1.0 µm or more while suppressing the occurrence of the pit or the crack.

As shown in FIG. 2, similarly to the first stacked portion 30, the second stacked portion 50 has a stacked structure in which AlN layers 51 and C—GaN layers 52 are alternately stacked on top of each other. Each AlN layer 51 and the C—GaN layer 52 are several nanometers in thickness, and are alternately stacked on top of each other using the MOCVD or the MBE method. The entire thickness of the second stacked portion 50, for example, is 0.5 µm to 1.5 µm. Therefore, the second stacked portion 50, for example, is formed by repeatedly stacking the AlN layer 51 and the C—GaN layer 52 that are several nm's in thickness until the thickness of 0.5 µm to 1.5 µm is obtained.

Then, the C—GaN layer 52 is formed while doping with carbon. Carbon concentration of the C—GaN layer 52, for example, is $1 \times 10^{18}/cm^3$ to $3 \times 10^{19}/cm^3$, and is higher than the carbon concentration of the C—GaN layer 40. Accordingly, an electric charge that occurs in the C—GaN layer 52 is compensated for (dissipated) by the carbon. Therefore, as with the first stacked portion 30, the second stacked portion 50 can also maintain a high resistance state, and suppress the leakage current. As a result, a decrease in the breakdown voltage of the semiconductor device 1 can be suppressed.

On the other hand, as with the C—GaN layer 52, the formation of the GaN layer while doping with carbon is the main factor that decreases the quality of the GaN crystal and forms the pit or the crack. Therefore, when the second stacked portion 50 is simply thickened in order to improve the breakdown voltage of the semiconductor device 1, it is easy for the pit or the crack to occur in the second stacked portion 50. The pit or the crack can propagate to other films (the ud-GaN layer 60, the AlGaN layer 70, and the like) that are formed on the upper surface of the second stacked portion 50, and further become a large pit or a large crack, respectively. According to the present embodiment, by providing the C—GaN layer 40, the thickness of the second stacked portion 50 is also decreased and thus the occurrence of the pit or the crack is suppressed. As described above, a structure of the second stacked portion 50 may be the same as a structure of the first stacked portion 30.

The C—GaN layer 40 can be said to have the same relationship with the second stacked portion 50 as with the first stacked portion 30. The thickness of the C—GaN layer 40 is significantly greater than the thickness of each of the AlN layers 51 and the C—GaN layers 52. Furthermore, the carbon concentration of the C—GaN layer 40 is lower than the carbon concentration of the C—GaN layer 52.

In this manner, the second buffer layer 100 includes the C—GaN layer 40 interposed between the first stacked portion 30 and the second stacked portion 50. Each of the first stacked portion 30 and the second stacked portion 50 is thickened to the extent that the pit or the crack does not occur. That is, regardless of that fact that a sum of the thickness of the first stacked portion 30 and the thickness of the second stacked portion 50 is approximately 1 µm to 3 µm thick, because the C—GaN layer 40 that has comparatively low carbon concentration is interposed between the first stacked portion 30 and the second stacked portion 50, the occurrence of the pit or the crack is suppressed. In other words, the C—GaN layer 40 divides the stacked portion that, as a whole, is thick, into the first stacked portion 30 and the second stacked portion 50, and this division suppresses the occurrence of the pit or the crack. Furthermore, the C—GaN layer 40 has the same thickness as the first and second stacked portions 30 and 50, but has lower carbon concentration than the C—GaN layers 32 and 52. Accordingly, the C—GaN layer 40 can improve the breakdown voltage of the semiconductor device 1, and can suppress the current collapse phenomenon.

An increase in thickness that results from summing the thickness of the first stacked portion 30 and the thickness of the second stacked portion 50 means that the breakdown voltage of the semiconductor device 1 is improved and functions as a buffer in an improved manner. Therefore, according to the present embodiment, the interposing of the C—GaN layer 40 between the first stacked portion 30 and the second stacked portion 50 can suppress the occurrence of the pit or the crack, can improve the breakdown voltage of the semiconductor device 1 and can suppress warping or the like of the substrate 10. The C—GaN layer 40 further increases the thickness of the entire second buffer layer 100 (to the extent of approximately 1.5 μm to 4 μm). Accordingly, the breakdown voltage of the semiconductor device 1 can be improved while suppressing the occurrence of the pit or the crack.

If the thick second buffer layer 100 is formed by repeatedly stacking the AlN layers 31 (or 51) and the C—GaN layers 32 (or 52) on top of each other in a simple manner without providing the C—GaN layer 40, it is easy for the pit or the crack to occur in the second buffer layer 100, and the more the buffer layer is thickened, the greater the bit or the crack that propagates to other layers. Therefore, when the buffer layer is simply thickened in order to improve the breakdown voltage of the semiconductor device 1, front surface states of the second buffer layer 100, and the ud-GaN layer 60 and the AlGaN layer 70 that are formed on the surface of the second buffer layer 100 and over the second buffer layer 100, respectively, deteriorate.

In contrast, in the second buffer layer 100 of the semiconductor device 1 according to the present embodiment, the C—GaN layer 40 is provided between the first stacked portion 30 and the second stacked portion 50. Accordingly, each of the first stacked portion 30 and the second stacked portion 50 can be thickened to the extent that the pit or the crack does not occur, and the thickness of the entire second buffer layer 100 can be increased. As a result, the breakdown voltage of the semiconductor device 1 can be improved while suppressing the occurrence of the pit or the crack in the ud-GaN layer 60 and the AlGaN layer 70.

First Modification Example

Figure 3:
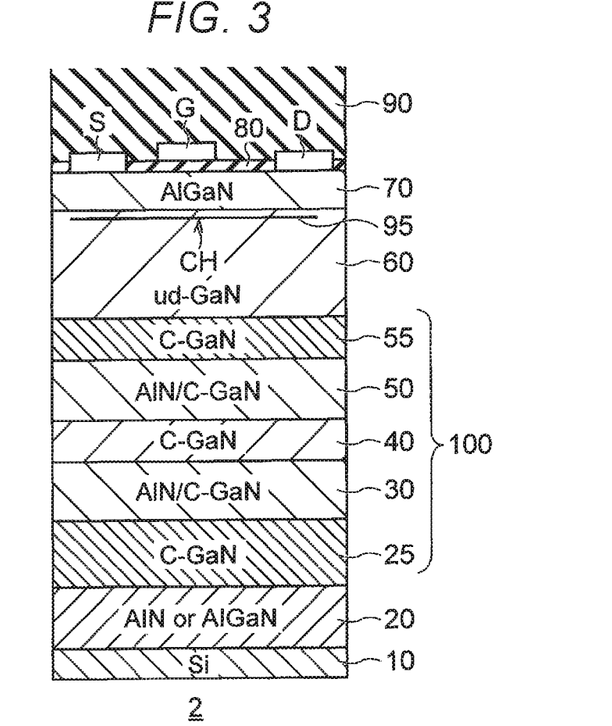
FIG. 3 is a cross-sectional diagram of one example of a constitution of a semiconductor device according to a first modification example of the present embodiment.

FIG. 3 is a cross-sectional diagram illustrating one example of a constitution of a semiconductor device 2 according to a first modification example of the present embodiment. A second buffer layer 100 according to the first modification example further includes a C—GaN layer 25 and a C—GaN layer 55. Other constitutions of the semiconductor device 2 according to the first modification example may be the same as the constitutions that correspond to the above-described semiconductor device 1.

The C—GaN layer 25 as an eighth nitride semiconductor layer is provided between the first buffer layer 20 and the first stacked portion 30. As with the C—GaN layer 40, the thickness of the C—GaN layer 25 is greater than the thickness of each of the AlN layers 31 and 51 and the thickness of each of the C—GaN layers 32 and 52. For example, the thickness of the C—GaN layer 25 is 0.5 μm to 1.5 μm. However, carbon concentration of the C—GaN layer 25 is lower than the carbon concentration of each of the C—GaN layers 32 and 52. For example, the carbon concentration of the C—GaN layer 25 is $1 \times 10^{17}/cm^3$ to $1 \times 10^{19}/cm^3$. Accordingly, as with the C—GaN layer 40, the C—GaN layer 25 can improve the breakdown voltage of the semiconductor device 1 and suppress the current collapse phenomenon. Furthermore, if the crystal quality of the first buffer layer 20 is not satisfactory, and the pit or the crack is present in a front surface thereof, the C—GaN layer 25 can bury the pit or the crack on the front surface of the first buffer layer 20. Therefore, if the front surface state of the first buffer layer 20 is not satisfactory, the provision of the C—GaN layer 25 is effective.

The C—GaN layer 55 as a ninth nitride semiconductor layer is provided between the second stacked portion 50 and the ud-GaN layer 60. As with the C—GaN layer 40, the thickness of the C—GaN layer 55 is greater than the thickness of each of the AlN layers 31 and 51 and the thickness of each of the C—GaN layers 32 and 52. For example, the thickness of the C—GaN layer 55 is 0.5 μm to 1.5 μm. However, carbon concentration of the C—GaN layer 55 is lower than the carbon concentration of each of the C—GaN layers 32 and 52. For example, the carbon concentration of the C—GaN layer 55 is $1 \times 10^{17}/cm^3$ to $1 \times 10^{19}/cm^3$. Accordingly, as with the C—GaN layer 40, the C—GaN layer 55 can improve the breakdown voltage of the semiconductor device 2 and suppress the current collapse phenomenon.

In this manner, the C—GaN layer 25 is further provided on the lower surface of the first stacked portion 30 and the C—GaN layer 55 is further provided on the upper surface of the second stacked portion 50, and thus the thicknesses of the second buffer layer 100 is increased, and the breakdown voltage of the semiconductor device 2 is further improved. Furthermore, the C—GaN layers 25 and 55 can improve the breakdown voltage of the semiconductor device 2, and can suppress the current collapse. Therefore, the semiconductor device 2 according to the first modification example can further improve the breakdown voltage of the semiconductor device 2 and suppress the current collapse while suppressing the occurrence of the pit or the crack in the ud-GaN layer 60 and the AlGaN layer 70. Additionally, in the first modification example, the same effect as in the above-described embodiment can be obtained.

Second Modification Example

Figure 4:
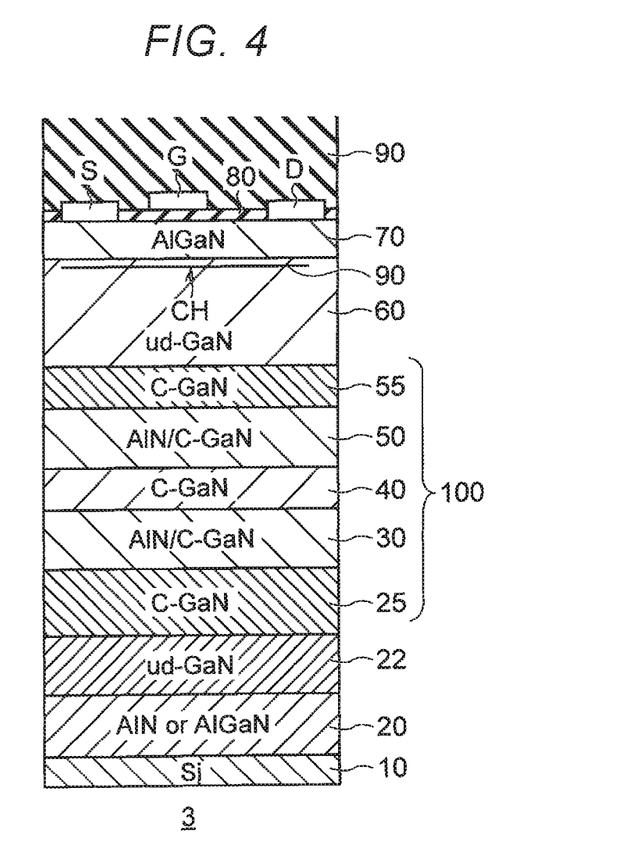
FIG. 4 is a cross-sectional diagram of one example of a constitution of a semiconductor device according to a second modification example of the present embodiment.

FIG. 4 is a cross-sectional diagram illustrating one example of a constitution of a semiconductor device 3 according to a second modification example of the present embodiment. A second buffer layer 100 according to the second modification example further includes an ud-GaN layer 22. In this case, the first buffer layer 20 as an eleventh nitride semiconductor layer is interposed between the substrate 10 and the ud-GaN layer 22. Other constitutions of the semiconductor device 2 according to the second modification example may be the same as the constitutions that correspond to the above-described semiconductor device 2 according to the first modification example.

The ud-GaN layer 22 as a tenth nitride semiconductor layer is provided between the first buffer layer 20 and the C—GaN layer 25. For the ud-GaN layer 22, as with the ud-GaN layer 60, the undoped GaN layer into which impurities, such as carbon, are not intentionally doped is used. Therefore, carbon concentration of the ud-GaN layer 22 is lower than that of each of the C—GaN layers 25, 32, 40, 52, and 55. Furthermore, the thickness of the ud-GaN layer 22 may be arbitrary. The ud-GaN layer 22 further improves the breakdown voltage of the semiconductor device 3, reduces the pit or the crack that is formed in the first buffer layer 20, and flattens the front surface of the first buffer layer 20. Accordingly, the ud-GaN layer 22 can suppress the pit or the crack in the first buffer layer 20 from propagating to the second buffer layer 100, the ud-GaN layer 60, and the AlGaN layer 70, and make the front surface states of the second buffer layer 100, the ud-GaN layer 60, and the AlGaN layer 70 satisfactory. Additionally, in the second modification example, the same effect as in the first modification example can be obtained.

While certain embodiments have been described, these embodiments have been presented by way of example only, and are not intended to limit the scope of the exemplary embodiment. Indeed, the novel embodiments described herein may be embodied in a variety of other forms; furthermore, various omissions, substitutions and changes in the form of the embodiments described herein may be made without departing from the spirit of the exemplary embodiment. The accompanying claims and their equivalents are intended to cover such forms or modifications as would fall within the scope and spirit of the exemplary embodiment.

What is claimed is:

1. A semiconductor device comprising:
a substrate;
a first stacked portion located above the substrate, the first stacked portion comprising at least one first nitride semiconductor layer containing aluminum and a second nitride semiconductor layer containing carbon;
a third nitride semiconductor layer located on an upper surface of the first stacked portion, the third nitride semiconductor layer containing carbon and having a greater thickness than each of the first and second nitride semiconductor layers, the third nitride semiconductor layer having a lower carbon concentration than the second nitride semiconductor layer;
a second stacked portion located on an upper surface of the third nitride semiconductor layer, the second stacked portion comprising a fourth nitride semiconductor layer containing aluminum and a fifth nitride semiconductor layer containing carbon;
a sixth nitride semiconductor layer located on the second stacked portion;
a seventh nitride semiconductor layer located on an upper surface of the sixth nitride semiconductor layer and containing aluminum; and
a first electrode located on an upper surface of the seventh nitride semiconductor layer.

2. The device according to claim 1, further comprising:
a second electrode located on the upper surface of the seventh nitride semiconductor layer; and
a third electrode located above the seventh nitride semiconductor layer and between the first electrode and the second electrode.

3. The device according to claim 1,
wherein the third nitride semiconductor layer is a carbon containing $Al_xGa_{(1-x)}N$ layer, where $0 \leq x < 1$.

4. The device according to claim 1,
wherein the first nitride semiconductor layer is aluminum nitride, and
the second nitride semiconductor layer is gallium nitride containing carbon.

5. The device according to claim 1,
wherein the fourth nitride semiconductor layer is aluminum nitride, and
wherein the fifth nitride semiconductor layer is gallium nitride containing carbon.

6. The device according to claim 1,
wherein the third nitride semiconductor layer is greater in thickness than each of the fourth and fifth nitride semiconductor layers and has a lower carbon concentration than the fifth nitride semiconductor layer.

7. The device according to claim 1, further comprising:
an eighth nitride semiconductor layer located between the substrate and the first stacked portion and that is greater in thickness than each of the first, second, fourth, and fifth nitride semiconductor layers and has a lower carbon concentration than each of the second and fifth nitride semiconductor layers; and
a ninth nitride semiconductor layer located between the first stacked portion and the sixth nitride semiconductor layer and that is greater in thickness than each of the first, second, fourth, and fifth nitride semiconductor layers and has lower carbon concentration than each of the second and fifth nitride semiconductor layers.

8. A semiconductor device comprising:
a substrate;
a first nitride semiconductor layer located on the substrate;
a second nitride semiconductor layer located over the first nitride semiconductor layer, the second nitride semiconductor layer having a first portion comprising a first stack of first nitride sub-layers and second nitride sub-layers, a second portion located on the first portion and comprising a carbon doped nitride layer, and a third portion located on the second portion and comprising a second stack of first nitride sub-layers and second nitride sub-layers, the second nitride sub-layers in the first and second stacks being doped with carbon;
an undoped, third nitride semiconductor layer located over the third portion of the second nitride semiconductor layer; and
a fourth nitride semiconductor layer located over the third nitride semiconductor layer, wherein
the second portion of the second nitride semiconductor layer has a carbon concentration that is less than a carbon concentration of the second nitride sub-layers,
the thickness of the second portion of the second nitride semiconductor layer is greater than the thickness of each first nitride sub-layer, and
the thickness of the second portion of the second nitride semiconductor layer is greater than the thickness of each second nitride sub-layer.

9. The semiconductor device according to claim 8, further comprising:
a first electrode and a second electrode in electrical contact with the fourth nitride semiconductor layer; and
a third electrode located over the fourth nitride semiconductor layer and between the first electrode and the second electrode.

10. The semiconductor device according to claim 9, wherein a two-dimensional electron gas is formed at an interface of the third and the fourth nitride semiconductor layers.

11. The semiconductor device according to claim 9, wherein the first nitride sub-layers each comprise aluminum nitride and the second nitride sub-layers each comprise carbon doped gallium nitride.

12. The semiconductor device according to claim 8, further comprising:
a fifth nitride semiconductor layer between the first and the second nitride semiconductor layers; and
a sixth nitride semiconductor layer between the second and the third nitride semiconductor layers.

13. The semiconductor device according to claim 12, further comprising:
a seventh nitride semiconductor layer between the first and the fifth nitride semiconductor layers.

14. The semiconductor device according to claim 12, wherein the fifth and the sixth nitride semiconductor layers each comprise carbon doped GaN.

15. A method of manufacturing a nitride semiconductor device, comprising:
forming a first nitride semiconductor layer on a substrate;
forming a second nitride semiconductor layer over the first nitride semiconductor layer, the second nitride semiconductor layer having a first portion comprising a first stack of first nitride sub-layers and second nitride sub-layers, a second portion on the first portion and comprising a carbon doped nitride layer, and a third portion on the second portion and comprising a second stack of first nitride sub-layers and second nitride sub-layers, the second nitride sub-layers in the first and second stacks being doped with carbon;

forming an undoped, third nitride semiconductor layer over the third portion of the second nitride semiconductor layer; and forming a fourth nitride semiconductor layer over the third nitride semiconductor layer, wherein the second portion of the second nitride semiconductor layer has a carbon concentration that is less than a carbon concentration of the second nitride sub-layers, the thickness of the second portion of the second nitride semiconductor layer is greater than the thickness of each first nitride sub-layer, and the thickness of the second portion of the second nitride semiconductor layer is greater than the thickness of each second nitride sub-layer.

16. The method according to claim 15, further comprising:

forming a first electrode and a second electrode in electrical contact with the fourth nitride semiconductor layer; and forming a third electrode over the fourth nitride semiconductor layer and between the first electrode and the second electrode.

17. The method according to claim 16, wherein a two-dimensional electron gas forms at an interface of the third and fourth nitride semiconductor layers.

18. The method of claim 17, wherein the first nitride sub-layers each comprise aluminum nitride and the second nitride sub-layers each comprise carbon doped gallium nitride.

19. The semiconductor device according to claim 8, wherein the first nitride sub-layers alternate with the second nitride sub-layers in the first stack, and the first nitride sub-layers alternate with the second nitride sub-layers in the second stack.

* * * * *